United States Patent [19]
Ovshinsky et al.

[11] Patent Number: 5,520,953
[45] Date of Patent: May 28, 1996

[54] METHOD OF ALIGNING THE DISCRETE GRAINS OF A MULTI-GRAINED SUPERCONDUCTING MATERIAL

[75] Inventors: Standford R. Ovshinsky, Bloomfield Hills; Rosa Young, Troy, both of Mich.

[73] Assignee: Energy Conversion Devices, Inc., Troy, Mich.

[21] Appl. No.: 604,532

[22] Filed: Oct. 29, 1990

Related U.S. Application Data

[63] Continuation of Ser. No. 442,380, Nov. 28, 1989, Pat. No. 5,340,792, which is a continuation of Ser. No. 78,353, Jul. 28, 1987, abandoned.

[51] Int. Cl.$^6$ ........................................... B05D 5/06
[52] U.S. Cl. .................... 427/62; 427/70; 428/930; 252/521
[58] Field of Search ................... 501/1, 742, 780, 501/778; 428/930; 427/62, 70; 252/521

[56] References Cited

U.S. PATENT DOCUMENTS 4,608,097 8/1986 Weinberger et al. ................ 427/155 X
4,761,302 8/1988 Weil ................................ 427/255.1 X

OTHER PUBLICATIONS

Politis et al, *Preparation of—And Y $Ba_2Cu_3O_{6.5}$*, Extendon Abstracts, MRS Spring Conf. Apr. 1987, pp. 141–143.

Cava et al, *Bulk Superconductivity—Perovskite $Ba_2Y$ $Cu_3O_9$–8*, Phys. Review Letters, vol. 58, No. 16, 20 Apr. 1987, pp. 1676–1679.

*Primary Examiner*—Peter A. Nelson
*Attorney, Agent, or Firm*—Marvin S. Siskind

[57] ABSTRACT

A method of substantially aligning the superconducting grains of a multi-grained perovskite defect oxide type material, which material includes at least one superconducting phase. In the superconducting phase of such perovskite materials, the unit cells thereof include a plurality of substantially parallel metal oxide planes spacedly disposed along the c axis thereof. The aforementioned alignment of discrete grains of the multi-grained superconducting material occurs along the c axis.

10 Claims, 2 Drawing Sheets

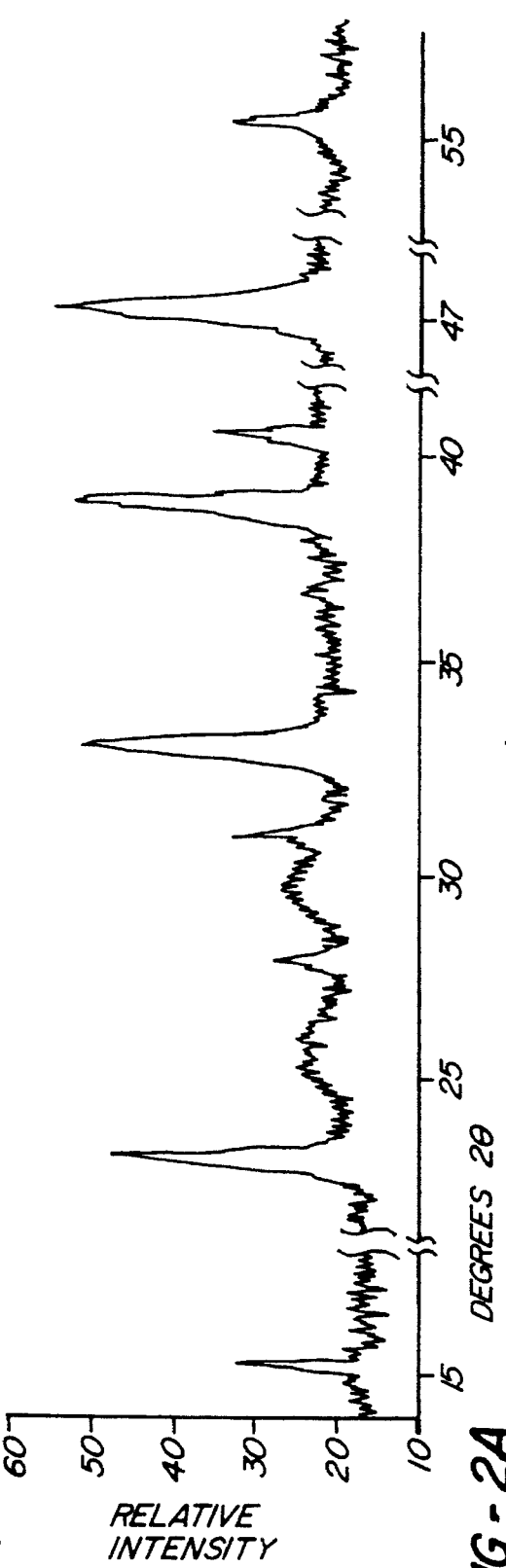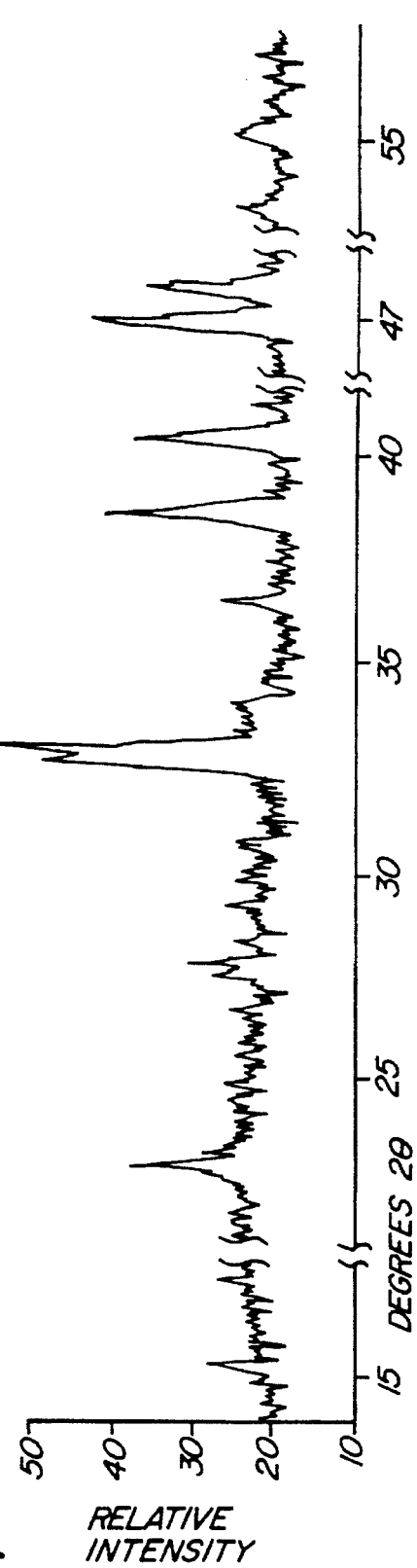

METHOD OF ALIGNING THE DISCRETE GRAINS OF A MULTI-GRAINED SUPERCONDUCTING MATERIAL

This application is a continuation of application Ser. No. 442,380, filed Nov. 28, 1989, now U.S. Pat. No. 5,340,792, which is a continuation of 078,353, filed Jul. 28, 1987, now abandoned.

FIELD OF THE INVENTION

The instant invention relates generally to a new class of perovskite ceramic defect oxide type superconducting materials (also referred to hereinafter as "ceramic based fluoro-oxide materials"). More specifically, the instant invention relates to multi-grained, perovskite ceramic defect oxide type materials, which include at least one superconducting phase and which are parametrically modified so as to increase the alignment of a substantial volume fraction of at least the discrete superconducting grains along a preferred axis of the unit cell thereof. In those instances wherein the alignment is chemically influenced, fluorine is employed as the parametric modifier element and the parametrically modified, perovskite material is represented by the formula $M_v^{IIIA}M_w^{IIA}M_x^{IB}O_yF_z$, wherein $M^{IIIA}$ is a Group IIIA metal, $M^{IIA}$ is a Group IIA metal, $M^{IB}$ is a Group IB metal, O is oxygen, F is fluorine, the parametric modifier, and wherein v is approximately 1, w is approximately 2, x is approximately 3, y is in the range of 5.5 to 9.0 and z is in the range of 0.1 to 5. While the exact manner in which the parametric modifier influences the alignment of the discrete grains of the high $T_c$ superconducting phase is not fully understood, there is disclosed herein uncontrovertible evidence that such a chemical modifier element operates to orient said grains along a preferred axis of growth.

BACKGROUND OF THE INVENTION

The accomplishment of attaining high-temperature superconductivity is of immense scientific and technological importance. Several critical transition temperature barriers have been breached since the long standing record temperature of 23.2 degrees Kelvin for $Nb_3Ge$ was exceeded. However, the ultimate benchmark of room temperature superconductivity remained an unattainable goal until the instant inventors developed a process for successfully introducing parametrically modifier elements into the aforementioned class of ceramic defect oxide materials so as to fabricate a new class of high critical transition temperature materials.

In late 1986, the superconducting properties of certain defect oxide type materials, which materials are variations of a well-known class of inorganic structures called perovskites, were observed by Bednorz and Mueller. The Bednorz and Mueller work was based upon materials developed by Michel and Raveau. The materials which Bednorz and Mueller observed contained lanthanum, barium, copper, and oxygen, and were reported to be superconducting at a temperature of about 30 degrees Kelvin.

Subsequently, many workers in the field became involved in efforts that resulted in the increase of the critical temperature, $T_c$ (the temperature at which electrons are able to move through a material without encountering any resistance to that motion), by the substitution of yttrium for lanthanum. Upon analysis, the superconducting composition was found to be a perovskite defect oxide of the $Y_1Ba_2Cu_3O_7$ type, possible an orthorhombically distorted perovskite. This composition has also been referred to as a tetragonal, square-planar structure (see P. H. Hor, R. L. Meng, Y. Q. Wang, L. Gao, Z. J. Huang, J. Bechtold, K. Forster and C. W. Chu, *Superconductivity Above 90 K In the Square Planar Compound System $ABa_2Cu_3O_{6+x}$ With A=La, Nd, Sm, Gd, Gn and Lu*, Mar. 17, 1987) with the $Y_1Ba_2Cu_3O_y$ defect oxide perovskite phase being responsible for the superconducting properties. Further work with this phase effectively raised the critical temperature to a few degrees above 90 degrees Kelvin (a temperature above the atmospheric boiling point of liquid nitrogen).

However, up to this point in time, scientists in the field had been unable to raise the temperature of superconducting materials to the temperature of the environment, i.e., room temperature. Therefore, prior to the work of the instant inventors at the laboratory at Energy Conversion Devices, Inc., three plateaus in raising the critical temperature of superconducting materials had been broached. The first plateau was represented by the pre-ceramic oxide superconducting materials, which materials were limited to a $T_c$ of about 23–25 degrees Kelvin; the second plateau was represented by the work of Bednorz and Mueller on lanthanum, barium, copper and oxygen systems, which systems resulted in superconducting temperatures of about 30 degrees Kelvin; and the third plateau was represented by the yttrium, barium, copper and oxygen systems, which systems provided for a rise in critical temperature to about 90–95 degrees Kelvin. However, it was not until the development of the new class of parametrically modified ceramic based fluoro-oxide materials by Energy Conversion Devices, Inc. that the critical benchmark of room temperature superconductivity became attainable.

Later workers in the field have attempted the total and/or partial replacement of the yttrium and/or lanthanum with other Group IIIA metals (including Rare Earths), especially with scandium, europium, lutetium, neodymium, praseodymium and gadolinium. The same and other workers in the field have also attempted the total and/or partial replacement of barium with other group IIA metals, such as strontium and calcium.

The defect oxide perovskite phase, having the general composition $M_1^{IIIA}M_2^{IIA}M_3^{IB}O_y$, was identified by several groups utilizing electron microprobe analysis, x-ray diffraction, scanning electron microscopy, and transmission electron microscopy. These groups have independentally characterized this defect oxide perovskite, $M_1^{IIIA}M_2^{IIA}M_3^{IB}O_y$ phase as having the crystallographic unit cell structure shown in FIG. 1.

The perovskite structure is similar to the naturally occurring calcium titanate structure, $CaTiO_3$, also shown by other $AB_2O_3$-type oxides having at least one cation much larger than the other cation or cations, including the tungsten bronzes, $NaWO_3$, strontium titanate, barium titanate, $YAlO_3$, $LaGaO_3$, $NaNbO_3$, $KNbO_3$, $KMgF_3$, $KNiF_3$, and $KZnF_3$, among others. In the perovskite structure the larger ions ($La^{+3}$=1.15 angstroms, $Ba^{+2}$=1.35 angstroms, and $O^{+2}$=1.40 angstroms, Linus Pauling, *The Nature of the Chemical Bond*, 3rd Edition, Table 13-3, "Crystal Radii and Univalent Radii of Ions") form a cubic close packed structure, with the smaller ions ($Cu^{+2}$=0.96 angstroms, $Y^{+3}$=0.90 angstroms, Pauling, op. cit.) arranged in occupying octahedral interstices in an ordered pattern. Together they form a cubic close packed (face centered cubic) array.

The superconducting perovskite type materials are ceramic based defect oxides. That is, the superconducting phases of the perovskite type materials are solids in which different kinds of atoms occupy structurally equivalent sites, and where, in order to preserve electrical neutrality, some sites are unoccupied, or vacant. Since these vacancies may be filled with mobile oxygen atoms, only local order is prevelant. It is also clear that these vacant atoms form lattice defects, which defects have, generally, profound affects upon the electrical parameters of the superconducting material, and more particularly upon the oxidation states of the copper atoms in the unit cell thereof.

In order to achieve yet higher critical temperatures, researchers at Energy Conversion Devices, Inc. realized that it would be necessary to develop a superconductivity material in which the chemistry thereof was engineered so as to alter the local chemical and electrical environment. For example, it has been established that the mobility of oxygen atoms in the $Y_1Ba_2Cu_3O_7$ ceramic based systems is very high and therefore the location of those mobile oxygen vacancies at any point in time contribute to the presence or absence of high $T_c$ superconducting phases. It is this oxygen mobility and changing local environment which results in the unstable electronic properties of this class of superconducting materials. Although definitive proof is not as yet available, the instant inventors have preliminary evidence that the addition of the very small and highly electronegative fluorine atoms operates to effectively occupy lattice sites in the ceramic based fluoro-oxide class of materials so as to cause "grid lock" and provide an impediment to the mobility of oxygen atoms. The result is a stabilized high critical temperature superconducting material.

The perovskite ceramic defect oxide system shown in FIG. 1 has a recurring structure of (1) a $M^{IB}$-O plane of a first type with vacant O sites, (2) a $M^{IIA}$-O plane, (3) a $M^{IB}$-O plane of a second type with fully occupied O sites, (4) a $M^{IIIA}$ plane with O sites, (5), another $M^{IB}$-O plane of the first type with fully occupied O sites, (6) another plane of the $M^{IIA}$-O type, and a (7) a second $M^{IB}$-O plane of the first type, with O site vacancies. It may thus be seen that the unit cell (of the superconducting material) so formed has seven substantially parallel planes (i.e., shown as ab planes) spacedly disposed along the substantially parallel to the c axis thereof. It can further be observed in FIG. 1, that the c axis represents the largest spatial dimension of the unit cell, (approximately 11.67 angstroms).

The central plane is a plane of the $M^{IIIA}$-O type, as a Y-O or La-O plane, with the Group IIIA metal being surrounded as its four coplanar corners by oxygen sites, which may be occupied or vacant. Immediately above and below this $M^{IIIA}$-O plane are equivalent $M^{IB}$-O planes of the second type, i.e., Cu-O planes, with the Group IB metal ions being at the four corners of the plane, and occupied oxygen sites being along each edge of the planes. These square planar $M^{IB}$ atoms (or ions), each surrounded by four oxygen atoms (or ions) have been reported to be critical to superconductivity in the defect oxide perovskites. A pair of $M^{IIA}$-O planes, as Ba-O planes lie atop and below these fully occupied first type $M^{IB}$-O planes. The $M^{IIA}$-O planes, formed with the Group IIA metal, as barium, at the center have fully occupied oxygen sites, with the oxygens disposed directly above and below the Group IB metal sites of the adjacent planes. The $M^{IIA}$-O planes are disposed between $M^{IB}$-O planes, as shown in FIG. 1, with the first type $M^{IB}$-O planes disposed on opposite sides thereof relative to the second type $M^{IB}$-O planes. As mentioned above, the deficiencies, that is, the vacancies (unoccupied sites) reported to reside in the first type $M^{IB}$-O planes are the result of the requirement of electrical neutrality. While the vacancies are generally reported to be in the $M^{IB}$-O planes, they may also be in the other planes, as in the $M^{IIA}$-O planes and/or in the $M^{IIIA}$-O planes.

While the aforementioned researchers have been responsible for the developments which occurred over the course of the last several months and which effectively raised the critical temperature of the aforementioned classes of superconducting materials up to about 90 degrees Kelvin; it was not until the work of the instant inventors, that the critical temperature of the high $T_c$ phases of said superconducting material have been raised beyond about the 90–95 degree Kelvin plateau. More particularly, the instant inventors have previously provided evidence (in the commonly assigned application referred to in the following paragraph) of superconducting phases in "modified" materials as high as 155 to 168 degrees Kelvin at which temperatures, a zero resistance state has been measured. These materials also presented magnetic indication of the presence of yet higher temperature superconducting phases of said superconducting material. In addition, electrical conduction measurements reveal that the "modified" superconducting materials of the instant inventors achieve a resistance value approximately four times lower than that of single crystal copper before the zero resistance state thereof is reached. This is taken as clear evidence of the presence of some volume fraction of other high transition temperature superconducting phases of the material. It is also worth noting that recent magnetic measurements of the modified superconducting material indicate superconducting phases as high as 370 to 390 degrees Kelvin (the temperature of boiling water).

The inventors of the instant invention, while working with the perovskite, ceramic defect oxide class of superconducting materials, have previously been successful in introducing at least one "parametric modifier" into the unit cell thereof so as to improve the superconducting properties of that class of superconducting materials. This introduction of parametric modifier elements through the use of a "shake and bake" powder metallurgical process was fully disclosed in commonly assigned, copending U.S. application Ser. No. 043,279, filed Apr. 27, 1987 by Stanford R. Ovshinsky and Rosa Young entitled "Parametrically Modified Superconducting Material", the disclosure of which is incorporated herein by reference. The incorporation of the parametric modifier into the superconducting phase resulted in overcoming what had appeared to be a barrier to raising the critical temperatures of superconducting material to additional heights. It was in this way that Ovshinsky, et. al. provided a new mechanism for controllably affecting fundamental parameters of said superconducting materials, which parameters determine the critical temperature thereof. It was also in this manner that the door was opened for further increases in critical temperatures of superconducting materials, even beyond the 155 to 168 degree Kelvin temperatures reported in said Ovshinsky, et. al. application. More specifically, the addition of the parametric modifier, fluorine, to the superconducting material resulted in the identification of a superconducting phase of said defect oxide type superconducting material which has recently been shown to achieve a critical temperature at about 90° F. (a temperature well above room temperature) with indications of the presence of yet higher temperature superconducting phases. It is to be additionally noted that the significance of room temperature superconductivity is more than a quantatative phenomena; said room temperature critical temperature makes possible a host of new applications which were heretofore unattainable.

While the aforementioned introduction of a parametric modifier element (such as fluorine) into a ceramic based defect oxide material successfully raised the critical temperature thereof to above room temperature, which room temperature superconductivity represented a goal long sought after by scientists in the field; recent researchers were not sure of the current carrying capabilities of said high critical temperature phases. However, this doubt has recently been resolved by scientists at Nippon Telegraph and Telephone in Japan who found that said high $T_c$ ceramic defect oxide material could carry current densities of approximately $1.8 \times 10^6$ amperes per square centimeter by measuring the current carried a single crystal thin film of a $Y_1Ba_2Cu_3O_7$ material in the direction of movement parallel to the ab planes, i.e., perpendicular to the c axis of the unit cell thereof. Further, the "1,2,3" crystal was found to be strongly anisotropic and could only carry about 10,000 amperes per square centimeter of current in a direction other than along said ab planes (which capacity of $1.8 \times 10^6$ amperes per square centimeter was about the same as that of the prior niobium tin class of superconducting materials). Of still further significance is the fact that the highest current density measured in the multiphase $Y_1Ba_2Cu_3O_7$ class of superconducting materials, as prepared by conventional powder metallurgical techniques, was about 10,000 amperes per square centimeters, i.e., the limiting current density parallel to the c axis.

The significance of these number is that the high $T_c$ phases of superconducting material of the $Y_1Ba_2Cu_3O_7$ class are highly unaligned and therefore the current density measured is limited by those grains thereof showing the highest resistance to current flow, in this case, the unaligned grains in which the current is measured along the c axis rather than along the ab planes. Only by aligning all of the discrete grains of a multi-grained superconducting material would it be possible to achieve the type of current densities which have been shown to exist. Further, epitaxially grown single crystal material is too costly for use in the fabrication of commercial devices and single crystals are inherently brittle and inflexible so that microcrystalline grains must be utilized in order to make it commercially feasible to fabricate wire or other flexible superconducting material. Therefore, it is imperative that the crystallites of such multi-grained ceramic based superconducting material be aligned along the c axes thereof in order to both attain flexible material and achieve high current densities. It is to just this objective that the subject invention is directed.

Further, since zero resistivity measurements on a bulk sample of powder metallurgically produced material has only a very small volume percentage of high $T_c$ superconducting phase material, the superconducting pathway must be through a fortuitously provided filamentary pathway extending between the two points of the probe. And since the axes of discrete grains of the high $T_c$ superconducting phase are randomly oriented, it is of no surprise that researchers had heretofore been unable to measure high current densities. Until such time as the volume formation of the high $T_c$ superconducting phases can be increased, it is essential that the volume fraction which is provided have the unit cells of the grains thereof substantially aligned so that the highest possible current densities can be achieved in the aforementioned filamentary pathways.

BRIEF SUMMARY OF THE INVENTION

It has now been found by the instant inventors and is the subject of the instant invention, that the use of a parametrically favorable environment, such as the addition of a parametric modifier element (for example fluorine) significantly increases the spatial alignment of at least a substantial number of the high critical temperature superconducting grains of the perovskite ceramic defect oxide type material. The alignment occurs along at least the c axis of the unit cells thereof, thus providing a filamentary pathway normal to the c axis of adjacent grains for superconductive current flow which has the beneficial effect of substantially optimizing current density through that pathway. The term "c axis alignment of discrete grain" will be used herein to mean that adjacent, discrete grains have the c axes thereof disposed in substantially parallel planes. The present inventors have also found that the introduction of fluorine parametrically modified the superconducting properties of the superconducting material to provide for the highest critical temperature phases heretofore measured by researchers in the field. Therefore, it is indeed surprising that the addition of said same parametric modifier element also serves to align the discrete superconducting grains along the c axis thereof so as to provide high current density output from even a filamentary pathway.

Perhaps the most important aspect of c axis alignment of discrete grains, as disclosed herein, relates to the deposition of thin films of ceramic based fluoro-oxide type superconducting material. Whereas, it has heretofore been necessary to provide a "template", i.e., an underlying substrate of substantially identical crystallographic structure desired to be obtained in the grains of high critical temperature superconducting material (upon which said thin film is deposited, as by e beam evaporation or co-sputtering); through the utilization of the "automatic chemical alignment provided by the parametric modifier element of the instant invention, it becomes possible to grow thin films of high $T_c$ material without providing said subjacent template-type substrate.

In an effort to help understand the manner in which the process disclosed in the subject specification promotes grain alignment, the term "solid state reaction" will be employed. As employed in this specification, said term is defined to refer to the temperature and pressure regime at which the constituent metals (introduced in the form of precursor compounds) are kinetically favorably released from that combined form so as to be able to interact with one another and combine into various phases, both superconducting and non-superconducting, typically associated with said ceramic based defect oxide class of materials. At the elevated temperatures which are necessary to kinetically effect a solid state reaction, the parametric modifier element either effuses from the precursor mixture into the gaseous environment or the element is initially introduced into the environment in gaseous form. As the metallic elements are released from the precursor compounds in which they were introduced and begin to interact, the parametric modifier element provides "seeding" or nucleating sites on the surface of the substantially molten material, from which surface further nucleation and growth of substantially oriented grains of the high $T_c$ superconducting material proceeds concurrently with the diffusion of the parametric modifier element more deeply into the interior of the material. Of course, this description of the growth of highly oriented microcrystallites through the aforedescribed diffusion mechanism has not been confirmed and therefore the instant invention is not dependent upon the accuracy of that analysis.

As used herein, the term "parametric modifier" refers generally to the modification of the local environment and/or the local chemistry of the superconducting material in such a manner as to affect one or more parameters which control or impact upon the critical temperature of the superconducting phase. Examples of such additional control parameters are those related to the BCS model (described in the aforementioned commonly assigned copending U.S. patent application Ser. No. 043,729), such as Debye Temperature, number of charge carriers above the Fermi sea, coupling constants and parameters related thereto. The Debye temperature, stated in simplified form, is a function of the stiffness of the lattice; however, it is possible that in a superconductive structure of this complexity, an equivalent structural or other mechanism may be operative in affecting the critical temperature. Hence, the term "effective Debye Temperature" will be used hereinafter to refer to a parameter of this general type.

In summary, the parametric modifier thus acts to modify the local chemistry or local environment of the unit cells and/or other structural and chemical configurations from which the superconducting material is fabricated so as to realize changes in the parameters (particularly parameters relating to the ability of the parametric modifier to cause substantial alignment of the unit cell along the c axis of at least the discrete high $T_c$ superconducting grains of superconducting material) affecting the critical temperature. The parametric modifier may also act to affect the interaction between the otherwise shielded orbitals of adjacent atoms of the unit cell, in particular and d orbitals and in some cases the f orbitals as well. The parametric modifier can additionally act to produce changes in certain parameters which are positive in their effects on the critical temperature while at the same time avoiding otherwise related adverse changes in other parameters which would negatively affect the critical temperature. Thus, normally dependent parameters are uncoupled from one another.

Through yet another mechanism, the parametric modifier may act to modify the local electrical environment of the superconducting material so as to provide control of the oxidation states of the Group IIB metal thereof. In this manner, a particular preferred oxidation state for higher critical temperatures of superconducting material may be locked in and/or stabilized.

Specifically, as used herein the parametric modifier is adapted to influence the propensity of at least a substantial percentage of the high $T_c$ superconducting grains of the multi-grained perovskite defect oxide type material to be aligned or oriented (said terms being synonymously employed), in such a manner as to improve the crystallographic alignment of said grains along the c axis of the material. As will be demonstrated herein, the addition of fluorine as a parametric modifier element significantly increases the alignment of said superconducting grains along the c axis of the unit cell of the perovskite defect oxide material (the c axis being defined as that axis which is substantially perpendicular to the spacedly disposed, a and b metal oxide planes of the unit cell), said c axis represented by the three dimensional coordinate plot [001]. As will be explained in detail hereinafter, this observed increase in grain alignment represents a significant improvement over the random grain alignment reported by other researchers in conventionally prepared $Y_1Ba_2Cu_3O_7$ type material (and as confirmed by the instant inventors). More specifically, conventionally prepared "1,2,3" material only shows about 27 percent alignment of the high $T_c$ superconducting grains, while the material prepared pursuant to the concepts disclosed by the instant invention shows up to 90% alignment along the c axis of the unit cells thereof.

Moreover, the present researches have hypothesized that the addition of a parametric modifier, such as fluorine, serves to increase $T_c$ in the superconducting material by altering the local electronic environment of the superconducting lattice. In addition thereto, by increasing the c axis alignment of said discrete superconducting grains, they have made a significant advance towards the ultimate goal of manufacturing thin film superconducting material characterized by a large number of small crystallites which can thereby provide for the fabrication of flexible wires of superconducting material. While the present inventors understand that other important processing steps must be overcome in order to fully realize the deposition of thin films of high $T_c$ superconducting material, the step of preparing substantially aligned superconducting grains in a normally randomly oriented perovskite ceramic defect oxide type superconducting material represents a significant milestone toward the realization of aligned thin film growth.

The local environments in such ceramic based oxide superconducting materials generally include oxygen vacancies which may be viewed as deviations from periodicity or in local order which affect the total interactive environment (TIE). The ability of the modifier to affect such variations from normal structural bonding (NSB) or such deviant electronic configurations (DECs) through modification of the local environment allows manipulation of the key parameters which influence the critical temperature of superconducting materials.

It is to be noted that one of the inventors of the subject invention, Mr. Ovshinsky, has previously discussed the coupling the decoupling of various physical properties of superconducting materials by controlling, on a molecular level, the relationship existing between the atoms thereof; however, while applicable to this class of superconducting material, such coupling and decoupling was accomplished for a different class of superconductors and required precision fabrication techniques. See, for example, U.S. Pat. No. 4,520,039, entitled Compositionally Varied Materials And Method for Synthesizing The Materials; U.S. Pat. No. 4,664,960 of the same title; and U.S. patent application Ser. No. 026,596, now abandoned, entitled Superconducting Materials. In comparison thereto, the technique for introducing the special parametric modifiers of the instant invention provides for the coupling and decoupling of physical and electrical properties of superconducting materials of the ceramic defect oxide type without the necessity of resorting to complicated fabrication techniques.

Therefore, the subject invention specifically provides a method for fabricating a parametrically modified, multi-grained, perovskite, ceramic defect oxide type material, wherein at least a substantial percentage of the superconducting grains contained therein are aligned along a preferred axis of the unit cell thereof, and wherein the the number of aligned grains is significantly increased, vis-a-vis, the number of grains aligned in a perovskite, ceramic defect oxide type material not parametrically modified in accordance with the process set forth in the subject application. Further, by employing the techniques outlined herein, it becomes possible to grow thin film superconducting material, which material is characterized by the ability to carry very high current densities, substantially similar to those current densities provided by the niobium tin class of superconducting materials.

These and other objects and advantages of the subject invention will become apparent from the Detailed Description of the Invention, the Drawings and the Claims which follow.

The invention described herein generally provides a method of forming a parametrically modified, multi-grained perovskite defect oxide type material, which material includes at least one superconducting phase and wherein at least a portion of the discrete superconducting grains thereof are substantially aligned along a preferred axis. The preferred alignment of the grains of superconducting material occurs along the c axis of the unit cell of the perovskite ceramic based defect oxide material. The method includes the specific steps of providing a precursor mixture of compounds capable of being treated so as to form an unaligned perovskite defect oxide type material, subjecting said precursor mixture to a treatment process so as to form a substantially randomly oriented multi-grained material having said at least one superconducting phase, and subjecting said precursor mixture to an orientation-inducing environment which is adapted to induce the alignment of the axes of the unit cells of at least a substantial percentage of the individual grains of the multi-grained material.

The unaligned perovskite defect oxide material is generally represented by the formula $M^{IIA}M^{IIIA}M^{IB}O$ where $M^{IIA}$ is a Group IIA metal, $M^{IIIA}$ is a group IIIA metal, $M^{IB}$ is a Group IB metal and O is oxygen. Further, in one embodiment of the invention, the parametric modifier may be chemically introduced into the material, such as through the use of a fluorinated compound. The introduction of the fluorinated compound into the perovskite defect oxide type material is such as to form a material represented by the generic formula $M_v{}^{IIA}M_w{}^{IIIA}M_x{}^{IB}O_yF_z$, wherein F is fluorine, v is approximately 2, w is approximately 1, x is approximately 3, y is within the range of 5.5 and 9.0 and z is within the range of 0.1 to 5.0.

The parametric modifier is preferably introduced into the perovskite ceramic based defect oxide material by exposing the precursor mixture of compounds to a source of said parametric modifier element. The introduction must be carried out in an environment which effects a solid state reaction between the parametric modifier element and the other components of the superconducting phases. More particularly, the perovskite precursor mixture of compounds may contain a compound including the parametric modifier element so that when said precursor mixture, including the parametric modifier element is fired in an oxidizing environment, at a preselected temperature and pressure regime, the aforementioned solid state reaction between the constituent elements occurs. It is during the course of this solid state reaction that the parametric modifier element serves to substantially align said perovskite ceramic based defect oxide material. While the instant inventors have found this method of preparation to effectively provide c axis alignment of the unit cells of discrete grains of the superconducting material, it is to be specifically noted that the instant invention is not limited to a single method. For example, it is equally preferred to chemically introduce the parametric modifier element into the conventionally prepared "1,2,3" material by firing the compounds of the precursor mixture in a gaseous atmosphere, which atmosphere includes a volatile form of the parametric modifier element so as to effect said alignment in the aforedescribed manner. Finally, the instant invention is not limited to embodiments in which the alignment is effected through a chemical modification, but rather through any process by which orientation occurs in a parametrically modified environment.

In the implementation of the concepts set forth in the solid state method of forming the superconducting material from solid precursors, the preferred precursor source of a parametric modifier, such as fluorine, may be selected from the group essentially comprising ammonium bifluoride, copper fluoride, barium fluoride and combinations thereof. In the gas phase method of forming the superconducting material from volatile precursors; the parametric modifier may be selected from the group essentially comprising $F_2$, HF, $SF_4$, $SF_6$, $NF_3$, $NF_5$, $PF_3$, $PF_5$, $BF_3$ and combinations thereof.

Further, through the implementation of the method disclosed herein, the present inventors have successfully and repeatably produced parametrically modified, multi-grained perovskite ceramic-based defect oxide type materials; which materials display significantly greater alignment of the discrete high $T_c$ superconducting grains along the c axis of the unit cells thereof, vis-a-vis, the alignment observed in perovskite ceramic defect oxide type materials which are not parametrically modified. It is additionally theorized by the instant inventors that it is this substantial increase in the alignment of discrete superconducting grains which is responsible for, or at least contributes to, the enhanced superconducting properties, including higher critical superconducting temperatures, which has been reported for this calls of ceramic based fluoro-oxide materials.

BRIEF DESCRIPTION OF THE DRAWINGS

FIG. 2A is a graphic representation of Relative Intensity plotted on the ordinate versus Degrees Two Theta plotted on the abscissa; said representation illustrating the lack of c axis grain alignment in a sample of the conventionally prepared perovskite defect oxide type material depicted in FIG. 1; and FIG. 2B is a graphic representation of Relative Intensity plotted on the ordinate versus Degrees Two Theta plotted on the abscissa; said representation illustrating the presence of substantially improved c axis grain alignment in a sample of parametrically modified ceramic based fluoro-oxide type material.

DETAILED DESCRIPTION OF THE INVENTION

Figure 1:
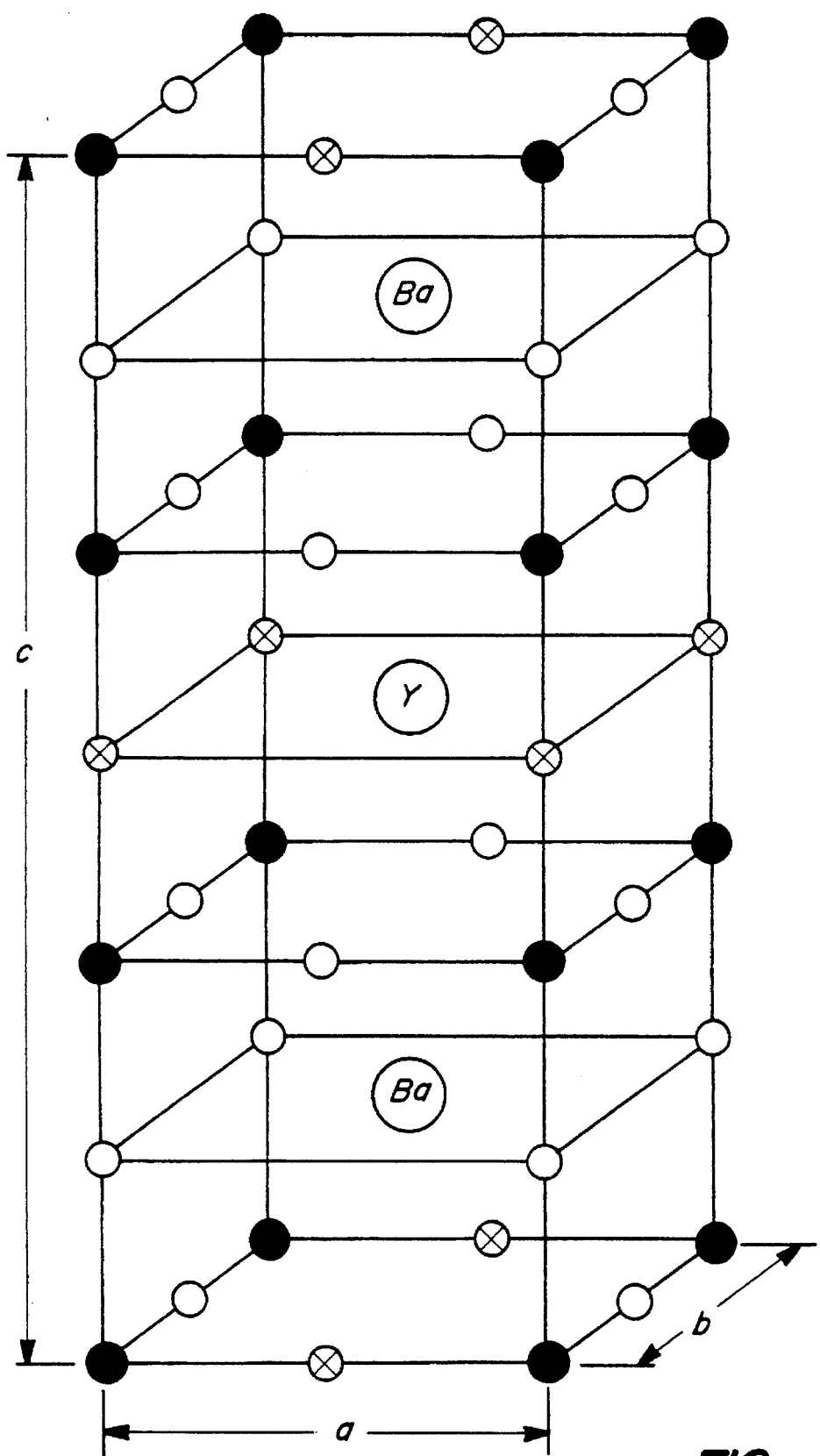
FIG. 1 illustrates the typical unit cell structure of a ceramic based defect oxide type superconducting material characterized by the composition $M^{IIB}M_{IIIB}M_{IA}O$ and particularly depicting and oxygen vacancies present in the CuO planes of that unit cell.

In order to enhance the superconducting properties of multi-grain Perovskite ceramic based defect oxide type superconducting material, including increasing the critical temperature thereof, i.e., the temperature at which superconductivity or zero resistance movement occurs, there is provided herein a method of forming said ceramic based defect oxide type superconducting material. These defect oxide Perovskite materials includes a plurality of metal species, oxygen, and in a preferred embodiment, an alignment inducing parametric modifier adapted to increase the spatial alignment of the unit cells of at least a substantial percentage of the superconducting grains of the perovskite material.

The method disclosed by one preferred embodiment of the instant invention is characterized by the controllable introduction of an alignment inducing parametric modifier into the unit cell of the multi-grained, ceramic based defect oxide superconducting material so as to occupy either vacant lattice sites or to partially substitute for oxygen atoms in those lattice sites which are otherwise occupied by oxygen in conventionally formed $Y_1Ba_2Cu_3O_7$ type material (or both). The chemical introduction of the alignment inducing parametric modifier is thus theorized to increase the thermodynamic stability of the ceramic based fluoro-oxide superconducting material, while significantly increasing the alignment of crystallites along the c axis of the unit cells of at least the high $T_c$ superconducting phases of the material. In this manner, the instant inventors have developed a method of introducing the alignment inducing, parametric modifier into the high $T_c$ superconducting material through a solid state reaction that can advantageously be applied to other thin film deposition techniques so as to render it be possible to fabricate thin film, flexible superconducting wire or other irregularly shaped material. Of particular interest is the "exchange" technique developed by the instant inventors in commonly assigned U.S. patent application Ser. No. 077,890, now U.S. Pat. No. 5,102,860 (our Case No. OSMC-015) entitled "Method of Controllably Introducing a Parametric Modifier Into a Ceramic Oxide Which Includes At Least One Superconducting Phase", the disclosure of which is incorporated herein by reference. Disclosed therein is a technique by which a substantially single phase material can be fabricated. While that technique requires the use of a temperature below the solid state reaction temperature of the constituent metals and the instant invention requires a temperature above the solid state reaction temperature of the constituent metals, if a portion of parameter space could be located in which these two seemingly diverse processes could coexist, it would be possible to fabricate a single phase, aligned, high Tc superconducting, multi-grained material by thin film deposition techniques.

The method disclosed by the instant invention relates to a solid state reaction in which the precursor compound of the alignment-inducing parametric modifier element can be introduced either by a metallic or a non-metallic compound containing the parametric modifier, e.g., fluorine; the precursor compound being capable of providing fluorine for incorporation into the perovskite ceramic based defect oxide material without otherwise deleteriously effecting the propensity of that perovskite precursor mixture to form a superconducting material. Preferably, the source of the parametric modifier, i.e., the fluorine-containing compound, is chemically stable at standard temperature and pressure and is capable of being excited, e.g., thermally excited, first to effuse the parametric modifier element into the deposition environment and then to reintroduce said element into the superconducting material.

As repeatedly alluded to hereinabove, fluorine may be selected as the preferred parametric modifier. While other elements may also be used as a parametric modifier, fluorine is preferred due to its relatively small atomic size and because of its status as the most electronegative of elements. According to one particular exemplification of the invention, a solid source in which the parametric modifier is incorporated in combined form, may be added to a precursor mixture of compounds and elements adapted to form a perovskite ceramic based defect oxide type material, in the presence of a high temperature, oxidizing environment. Such typical high temperature oxidizing conditions include temperatures of approximately 950° C. in an oxygen atmosphere wherein a solid state reaction is kinetically favored to occur between the compounds of the precursor mixture, thereby forming a perovskite ceramic based defect oxide type superconducting material. Said perovskite defect oxide material may be represented by the generic formula $M_v^I{}_{IA}M_w^{IIIA}M_x^{IB}O_y$, wherein $M^{IIA}$ is a Group IIA metal, $M^{IIIA}$ is a Group IIIA metal, $M^{IB}$ is a Group IB metal, O is oxygen, v is approximately 2, w is approximately 1, x is approximately 3 and y is in the range from 5.5 to 9.0.

The addition of the precursor source of a parametric modifier element to the precursor perovskite ceramic based mixture, when exposed to the previously mentioned high temperature oxidizing environment, undergoes a solid state reaction wherein fluorine gas first evolves into the environment and then diffuses through exposed surfaces of the heated mixture so as to be preferentially incorporated into the unit cell of the superconducting grains of the Perovskite defect oxide type material. The resulting high Tc superconducting phases of the material is represented by the formula $M_v^{IIA}M_w^{IIIA}M_x^{IB}O_yF_z$, wherein all symbols and variables are as previously defined, and further wherein F is fluorine, the parametric modifier element, and z is in the range from about 0.1 to 5.0.

While the aforementioned embodiment of the instant invention, the precursor source of the parametric modifier element is a solid and may be selected from any number of relatively stable fluorine containing compounds generally known to those skilled in the art, in the preferred practice of the method disclosed herein, the precursor source of fluorine is selected, without limitation, from a compound contained within the group consisting essentially of ammonium bifluoride, copper fluoride, barium fluoride and combinations thereof. In the gas phase method of forming the superconducting material, the precursor source of parametric modifier may be selected the group essentially consisting of $F_2$, HF, $SF_4$, $SF_6$, $NF_3$, $NF_5$, $PF_3$, $PF_5$, $BF_3$ and combinations thereof. This source of the parametric modifier element in combined form is added to the perovskite ceramic based precursor mixture, which generally includes copper oxide (CuO), barium carbonate ($BaCO_3$) and yttrium oxide ($Y_2O_3$), and which has been previously fired for a sufficient period of time (such as 48 hours) in a standard atmospheric environment at a temperature of about 950° C. to allow a solid state reaction of the constituent metals to occur. After adding said precursor source of the parametric modifier element to the previously fired perovskite ceramic based defect oxide material, the entire mixture is reacted to form the parametrically modified ceramic based fluoro-oxide superconducting material; for example, the precursor modifier and the defect oxide material are placed in the platinum crucible and heated to a temperature of about 950° C. for approximately 2.5 hours in an atmospheric environment. The temperature is allowed to slowly ramp down to about 400° C. where it is maintained for approximately 3 to 4 hours; thereafter, the mixture is cooled below 150° C., removed from the furnace and pressed into pellets. Finally, the pressed pellets are subjected to a sintering process in an oxygen rich environment. The entire process will be fully described in the accompanying examples which follow hereinafter.

Preparation in the aforedescribed manner results in the fabrication of multi-grained perovskite ceramic based fluoro-oxide superconducting materials characterized by a significantly greater proportion of c axis alignment of at least the high Tc unit cells of the superconducting grain, as compared with the c axis alignment which is displayed by the non-parametrically modified perovskite type superconducting materials.

At this point, it is necessary to again highlight the fact that a solid precursor source of a parametric modifier element is not required. Indeed the precursor source of a parametric modifier element can be introduced in a gaseous form so as to diffuse into the molten compounds of the metallic oxides and participate in the solid state reaction occurring therewithin. Note that even if the parametric modifier element is introduced in solidified form, it will effuse from the metallic compounds and only then diffuse back thereinto. Therefore, whether initially introduced as a solid or gas, the parametric modifier element must diffuse into the metallic oxide compounds in order to nucleate crystalline growth or otherwise work their magic of crystallite alignment so as to provide an optimized current carrying pathway between adjacent grains.

Referring now to FIG. 2A, there is graphically depicted therein a linear plot of an x-ray diffraction analysis illustrating the extent of c axis alignment present in crystallites of non-parametrically modified perovskite defect oxide type ("1,2,3") superconducting material. Along the abscissa is plotted the values for Degrees Two Theta, while the Relative Intensity is plotted along the ordinate. The diffraction peaks represent the reflections from the spacedly disposed planes of the unit cells of discrete grains; which peaks, can be correlated with the relative amount or intensity of c axis alignment present in those crystallographic planes, thereby demonstrating the degree of c axis alignment. The relative intensities of c axis alignment observed by the present inventors for the unmodified perovskite ceramic oxide ("1, 2,3") material, and implicity shown in FIG. 2A, correspond closely with those values reported by Cava, et. al. in *Phys. Rev. Lett.*, 58, 1676; thus confirming the "characteristic" c axis alignment present in unmodified perovskite defect oxide ("1,2,3") type superconducting materials. The amount of c axis alignment (along the [001] plane) in a given sample can be calculated to be equal to the sum of the values of the relative intensity of the volume fraction of those grains of a given sample which demonstrate c axis alignment, as compared to the value of the relative intensity of the remaining volume fraction of all other grains within the given sample. This relationship is mathematically expressed by the formula:

$$\Sigma f_{(001)} = \frac{I_{OBS}/I/I_o^{random}}{\Sigma I_{OBS}/I/I_o^{random}}$$

wherein $\Sigma$ is the symbol for summation; $f(001)$ is the volume fraction of peaks demonstrating c axis alignment; $I_{OBS}$ is the relative intensity of a given peak measurement; and $I/I_o^{ran}{}_{dom}$ is the relative intensity of the measurements reported by Cava, et. al. for the same peak being measured in the sample.

Using the formula set forth above and with the values derived from FIG. 2A and the measurements reported by Cava, et. al.; the value of $\Sigma$ f(001) is 0.34. This is to say, that approximately one-third of the crystallites of the unmodified perovskite ceramic based defect oxide ("1,2,3") sample demonstrated c axis alignment.

Turning now to FIG. 2B, there is graphically depicted therein a linear plot of an x-ray diffraction analysis of a parametrically modified perovskite ceramic based fluoro-oxide type superconducting material. Along the abscissa is plotted the value for Degrees Two Theta, while the Relative Intensity is plotted along the ordinate. The diffraction peaks represent the relative intensity of the reflection from the crystallographic planes in a sample of high $T_c$ superconducting material, which crystallographic data demonstrates a relatively large degree of c axis alignment.

In comparing the crystallographic measurements represented graphically in FIGS. 2A and 2B, it is important to not that peaks occurring at substantially similar values of Degrees Two Theta are indicative of the same crystallographic planes. A careful examination of the two figures therefore discloses a significant increase in the measured intensity of signals at 15, 23, 31, 39, 47 and 55 degrees Two Theta in FIG. 2B as compared to the measured intensity in FIG. 2A. This increase in the intensity dramatically demonstrates that a significantly greater number of the angular displacements of the c axes of the unit cells of superconducting grains are aligned in the parametrically modified ceramic fluoro-oxide material. Indeed, applying the previously described formula in conjunction with the corresponding values for peak-intensity observed in FIG. 2B and the standard values reported by Cava, et. al.; the value for the f[001] plane (the c axis) of the parametrically modified ceramic based fluoro-oxide type superconducting material is 0.78 (although samples have been measured showing up to 90% alignment). This demonstrates that over three-quarters of the discrete grains of the unit cells of the parametrically modified ceramic based fluoro-oxide type superconducting material demonstrate c axis alignment.

Thus is should be apparent that through the addition of fluorine as a parametric modifier, by the process set forth in the examples which follow, the c axis alignment of the crystallographic planes of the unit cells of the discrete grains of the perovskite ceramic based fluoro-oxide type superconducting materials is significantly increased.

It has, as was previously mentioned, further been speculated that the phenomenon of greater c axis alignment of discrete high Tc grains is accompanied by a corresponding increase in the critical temperature measured for zero resistant superconducting behavior. Additionally, by increasing the alignment of at least a substantial percentage of the superconducting grains within the defect oxide type material, the instant inventors have taken an important step towards the growth of high $T_c$ superconducting thin films. Finally, through the utilization of the techniques set forth hereinbefore, the current carrying capacity of the anisotropic superconducting grains which have been aligned is therefore maximized for any given material.

EXAMPLES

Samples of the perovskite defect oxide type of superconducting material comprising metal species and oxygen in combined form were prepared in both a parametrically modified, fluorinated state, and in a non-fluorinated state. The structural, chemical and other electrical properties of the samples were then compared to determine the effect of the parametric modifier in those perovskite ceramic defect oxide type materials.

Both the fluorinated and non-fluorinated samples of superconducting materials were initially prepared by blending specifically selected precursor compounds to form a perovskite defect oxide type precursor mixture. Specifically, the perovskite ceramic based precursor mixture contained a thoroughly mixed batch of the following powders, in the following proportions:

| Powder | Mass |
| --- | --- |
| CuO | 3.198 grams |
| BaCO$_3$ | 5.284 grams |
| Y$_2$O$_3$ | 1.513 grams |
| Total | 10.000 grams (80.42 millimoles) |

These two batches of perovskite precursor materials were each mixed in an alumina mortar, and then heated separately, in air, at standard pressure, in a platinum crucible according to the following time/temperature regime:

| Time | Temperature |
| --- | --- |
| 8 hours | 950 degrees Centigrade |
| 4 hours | Ramped from 950 degrees Centigrade down to 200 degrees Centigrade in situ |

After the time/temperature regime was completed, one of the two identical samples were exposed to a precursor source of the parametric modifier, fluorine. Said precursor source of fluorine, while capable of being selected from any number of fluorine containing compounds, was preferentially selected as ammonium bifluoride ($NH_3HF_2$). Said ammonium bifluoride is available from any commercial chemical manufacturers such as E. M. Scientific Company of Cherry Hill, N.J. Lot Number 5162, Catalog Number 1255-1. The precursor source of fluorine and the perovskite precursor material are then carefully measured out in the following proportions:

| Material | Mass |
| --- | --- |
| Perovskite Precursor | 3.280 grams |
| Parametric Modifier Precursor | 0.712 grams |
| Total | 4.00 grams |

These material were then thoroughly mixed in an alumina mortar, and then heated in air, at standard pressure, in a platinum crucible according to the following time/temperature regime:

| Time | Temperature |
| --- | --- |
| 2.5 hours | 900 degrees Centigrade |
| 2.0 hours | Ramped from 900 degrees Centigrade down to 400 degrees Centigrade in situ |

Following this regime, both the parametrically modified and unmodified samples are once again separately mixed in an alumina mortar, and then each sample is pressed into pellet-like configurations measuring approximately 1 centimeter in diameter by 1–2 millimeters in thickness, each of said pellets weighing approximately 1.3 grams; thus yielding in approximately three to five pellets per sample.

The two sets of sample pellets were then subjected, separately, to a sintering process, wherein each set of pellets, (one set being made up of parametrically modified pellets, and the other set being unmodified) were loaded into separate alumina carriers, so that each pellet in a give carrier was evenly spaced from the pellets loaded thereabout and so that only opposed side wall edges of said pellets contacted the alumina walls of the carrier. The two sets of pellets were then separately heated in an oxygen furnace, at standard pressure according to the following time/temperature regime:

| Time | Temperature |
| --- | --- |
| '16 hours | Ramped from 200 degrees Centigrade up to 950 degrees Centigrade |
| 48 hours | 950 degrees Centigrade |
| 6 hours | ramped from 950 degrees Centigrade down to 200 degrees Centigrade in situ |

After completing this time/temperature regime, the pellets were removed from the alumina carrier, cut into a plurality of slices and the physical and electrical properties thereof were measured. Specifically, each of the pellets were cut into a plurality of slices, parallel to the upper and lower surfaces of said pellets, and subjected to x-ray diffraction analysis; the results of which are graphically displayed in FIG. 2A and 2B, an explanation of which was previously set forth. These results may be summarized by stating that non-parametrically modified "1,2,3" material shows a random crystallite orientation of approximately 27 to 34% while the parametrically modified ceramic based fluoro-oxide superconducting material demonstrates a much higher crystallite orientation of over 78%, a substantial improvement which as significant ramifications in thin film fabrication.

In summary, there is provided by the method set forth in the subject specification, a technique of introducing a parametric modifier element into a ceramic oxide material in such a manner as to fabricate a high critical temperature phase of a multi-grained ceramic based fluoro-oxide superconducting material which, for the first time, shows positive evidence of c axis alignment of the discrete grains thereof. This technique is especially significant because the extreme anisotropy of the superconducting phases of the material results in substantial current carrying densities in one direction and relatively lesser current carrying densities in the other directions. By aligning the grains, the current carrying capacity of the material is not limited by the direction of lowest current carrying capacity, but rather, can be selected to flow along the preferred axis so as to display a capacity of up to about $2 \times 10^6$ amperes per square centimeter of superconducting material. It is further significant to note that the addition of the parametric modifier not only results in the aforementioned alignment of superconducting grains, but substantially raises the critical temperature at which the ceramic based fluoro-oxide materials of the instant invention become superconducting. Finally, the instant inventors have observed some evidence that the introduction of the parametric modifier element, fluorine, also serves to thermally and chemically stabilize the mobile oxygen atoms of said ceramic based fluoro-oxide material.

While the instant invention has been described with respect to certain examples and preferred embodiments, said examples and preferred embodiments are not intended to limit the scope of the invention; but rather, the instant invention should only be limited by the scope of the claims attached hereto and those equivalents thereof which would be obvious to those ordinarily skilled in the art.

What is claimed is:

1. A method of fabricating a multi-grained perovskite defect oxide type material having the composition $M^{IIIA}M^{II}_{IA}M^{IB}O$ where $M^{IIA}$ is a Group IIA metal, $M^{IIIA}$ is a Group IIIA metal, $M^{IB}$ is a Group IB metal and O is oxygen; the c-axis of more then 34 percent of the individual grains of said multi-grained material being oriented parallel to one another; and characterized by the following steps:

providing a precursor mixture capable of being treated so as to form a multi-grained randomly aligned, perovskite ceramic defect oxide type material, said precursor mixture including a barium-containing compounds, an yttrium-containing compound, and a copper-containing compound;

subjecting said precursor mixture to a high temperature, solid state treatment process so as to form said multi-grained perovskite defect oxide type material having at least one superconducting phase, the axes of the individual grains of the multi-grained material being randomly aligned; and diffusing a fluorinated gaseous parametric modifier into the superconducting phase of the perovskite defect oxide type material so as to orient the axes of more than 34 percent of the individual grains of the superconducting phase of the multi-grained material.

2. The method of claim 1, including the further step of firing said superconducting phase which incorporates said parametric modifier element so as to affect a solid state reaction wherein said multi-grained, substantially aligned perovskite defect oxide-type material is formed.

3. The method of claim 1, including the further step of firing said precursor mixture in an atmosphere which includes a reactive form of said fluorinated parametric, modifier so as to diffuse said parametric modifier into said superconducting phase.

4. The method of claim 1, including the further step of introducing $NF_3$ as the fluorinated gaseous compound to be diffused into said superconducting phase.

5. The method of claim 1, including the further step of of forming the parametrically modified perovskite defect oxide type material so as to have the stoichiometry represented by the formula $M_v^{IIA}M_w^{IIIA}M_x^{IB}O_yF_z$; wherein v is approximately 1, w is approximately 2, x is approximately 3, y is in the range of 5.5 to 9.0, and z is in the range of 0.1 to 5.0.

6. The material of claim 1, including the further step of exposing a mixed compound of $M^{IIA}$, $M^{IIIA}$ and $M^{IB}$ to an environment specifically adapted to oxidize said mixture into said multi-phase, multi-grained perovskite defect-oxide type material which includes said at least one superconducting phase.

7. The method of claim 1, including the further step of controlling the amount of the fluorinated gaseous parametric modifier diffused into the perovskite defect oxide type material so as to substantially prevent the formation of non-superconducting phases.

8. The method of claim 1, including the further step of forming the unit cell of the superconducting phase of the perovskite defect oxide type material so as to include a plurality of substantially parallel planes of metal oxide atoms spacedly disposed along a preferred axis thereof.

9. The method of claim 1, including the further step of orienting at least 78% of the grains of the multi-grained superconducting phase along the c-axis of the unit cells thereof.

10. The method of claim 1, including the further step of forming the perovskite defect oxide material from a precursor mixture which includes $BaCo_3$, $Y_2O_3$ and CuO.

* * * * *